US011275669B2

(12) United States Patent
Galles

(10) Patent No.: US 11,275,669 B2
(45) Date of Patent: Mar. 15, 2022

(54) METHODS AND SYSTEMS FOR HARDWARE-BASED STATISTICS MANAGEMENT USING A GENERAL PURPOSE MEMORY

(71) Applicant: Pensando Systems Inc., Milpitas, CA (US)

(72) Inventor: Michael B. Galles, Los Altos, CA (US)

(73) Assignee: Pensando Systems, Inc., Milpitas, CA (US)

( * ) Notice: Subject to any disclaimer, the term of this patent is extended or adjusted under 35 U.S.C. 154(b) by 78 days.

(21) Appl. No.: 16/925,239

(22) Filed: Jul. 9, 2020

(65) Prior Publication Data

US 2022/0012156 A1 Jan. 13, 2022

(51) Int. Cl.
*G06F 11/34* (2006.01)
*G11C 11/4096* (2006.01)
*G06F 11/30* (2006.01)

(52) U.S. Cl.
CPC ...... *G06F 11/3476* (2013.01); *G06F 11/3037* (2013.01); *G11C 11/4096* (2013.01)

(58) Field of Classification Search
CPC ............ G06F 11/3476; G06F 11/3037; G11C 11/4096
See application file for complete search history.

(56) References Cited

U.S. PATENT DOCUMENTS

| 5,794,252 | A | * | 8/1998 | Bailey | B65H 1/06 707/610 |
|---|---|---|---|---|---|
| 7,035,988 | B1 | | 4/2006 | Marino | |
| 7,117,197 | B1 | * | 10/2006 | Wong | G06F 16/217 |
| 9,262,554 | B1 | | 2/2016 | Bailey et al. | |
| 2004/0220959 | A1 | * | 11/2004 | Rothman | G06F 8/656 |
| 2007/0074014 | A1 | | 3/2007 | Musoll et al. | |
| 2009/0311659 | A1 | * | 12/2009 | Lottridge | G09B 19/08 434/353 |
| 2010/0223227 | A1 | * | 9/2010 | Zhao | G06F 16/24552 707/607 |
| 2014/0241361 | A1 | | 8/2014 | Bosshart et al. | |
| 2016/0216913 | A1 | | 7/2016 | Bosshart | |
| 2019/0132198 | A1 | | 5/2019 | Li et al. | |
| 2019/0347133 | A1 | | 11/2019 | Simmons et al. | |
| 2020/0044931 | A1 | | 2/2020 | Boon | |

OTHER PUBLICATIONS

Kanev, Svilen et al. "Mallace: Accelerating Memory Allocation", ASPLOS '17, Apr. 8 -12, 2017, 13 pgs.
Kaufmann, Antoine et al. "High Performance Packet Processing with FlexNIC", ASPLOS '16, Apr. 2-6, 2016, 15 pgs.
(Continued)

*Primary Examiner* — Ajay Ojha
(74) *Attorney, Agent, or Firm* — Loza & Loza, LLP

(57) ABSTRACT

Methods and systems for managing statistics in an I/O system are disclosed. Embodiments of the present technology may include a method for managing statistical data at an I/O system, the method including reading a statistic record from an array of statistic records according to a write request that is held in a register of a register interface. In some embodiments, the write request includes a data element. In some embodiments, the array of statistic records is stored in random access memory (RAM).

17 Claims, 14 Drawing Sheets

(56) References Cited

OTHER PUBLICATIONS

Parson, Dale "Real-time Resource Allocators in Network Processors using FIFOs", Proceedings of Advanced Networking and Communications Hardware Workshop (ANCHOR) 2004, Munich, Germany, Jun. 19, 2004, 9 pgs.
Sonchack, John et al. "Scaling Hardware Accelerated Network Monitoring to Concurrent and Dynamic Queries With *Flow", Proceedings of the 2018 USENIX Annual Technical Conference, Jul. 11-13, 2018, Boston, MA, 14 pgs.
Vinkler, M. et al. "Register Efficient Memory Allocator for GPUs", The Eurographics Association 2014, 9 pgs.
Emmerich, Paul et al. "User Space Network Drivers", ANCS'19, Association for Computing Machinery, 14 pgs.

* cited by examiner

METHODS AND SYSTEMS FOR HARDWARE-BASED STATISTICS MANAGEMENT USING A GENERAL PURPOSE MEMORY

BACKGROUND

In data networks, input/output (I/O) systems such as switches, routers, and network interface cards receive data (e.g., packets) at input interfaces, process the received data, and then forward the data to one or more output interfaces. It is important that such I/O systems operate as quickly as possible in order to keep pace with a high rate of incoming data. Additionally, I/O systems typically track certain statistics related to processing incoming data, including for example, statistics such as packet count and total bytes count, histograms such as packet distribution, and timestamps such as packet arrival time and request latency. Tracking such statistics in a high speed I/O system can be a resource intensive operation that can become a drag on system performance.

SUMMARY

Methods and systems for managing statistics in an I/O system are disclosed. Embodiments of the present technology may include a method for managing statistical data at an I/O system, the method including reading a statistic record from an array of statistic records according to a write request that is held in a register of a register interface. In some embodiments, the write request includes a data element. In some embodiments, the array of statistic records is stored in random access memory (RAM).

Embodiments may also include performing a statistic update operation in response to the write request to generate an updated statistic. In some embodiments, performing the statistic update operation involves executing an operation using the data element included with the write request that is held in the register interface and the statistic record that is read from the RAM. Embodiments may also include writing the updated statistic to the statistic record in the array of statistic records that is stored in the RAM.

In some embodiments, reading the statistic record from the array of statistic records may include generating a physical memory address from an index that is included in the write request and held in the register interface. In some embodiments, performing the statistic update operation involves update logic in the control hardware space of the I/O system adding a value of the data element to a value in the statistic record.

In some embodiments, the write request includes multiple data elements that correspond to different statistics. In some embodiments, multiple statistic records in the array of statistic records are updated in response to the multiple data elements in the write request. In some embodiments, reading the statistic record according to write request may include reading multiple adjacent statistic records in the array in the same read.

In some embodiments, the write request includes multiple data elements that correspond to different statistics. In some embodiments, the multiple adjacent statistic records in the array of statistic records are updated in response to the multiple data elements in the write request. In some embodiments, writing the updated statistic to the statistic record may include writing updated statistics for the multiple adjacent statistic records to the array in the same write.

Embodiments may also include processing multiple write requests corresponding to the same statistic record in the array serially in a register interface in control hardware space of the I/O system. Embodiments may also include receiving multiple write requests directed to the same statistic record at the register interface and performing the statistic updates in a batch process before the updated statistic is written back to the array of statistic records that are stored in the RAM.

Embodiments of the present technology may also include a method for managing statistical data at an I/O system, the method including reading a statistic record from an array of statistic records that is stored in RAM according to an index of a write request that is held in an address register of a register interface. In some embodiments, the write request also includes a data element that is held in a data register of the register interface.

Embodiments may also include performing a statistic update operation in response to the write request to generate an updated statistic. In some embodiments, performing the statistic update operation involves adding a value of the data element from the write request that is held in the register interface to a value in the statistic record that was read from the RAM. Embodiments may also include writing the updated statistic back to the statistic record that is stored in the RAM.

Embodiments of the present technology may also include a system for statistic management, the system including RAM that stores an array of statistic records. Embodiments may also include a register interface including, a register to receive a write request. In some embodiments, the write request includes an index and a data element. Embodiments may also include update logic configured to, read a statistic record from the array of statistic records that is stored in the RAM according to the index in the register interface. Embodiments may also include perform a statistic update operation in response to the write request to generate an updated statistic. In some embodiments, performing the statistic update operation involves executing an operation using the data element in the register interface and the statistic read from the RAM. Embodiments may also include write the updated statistic to the statistic record in the array of statistic records that are stored in the RAM.

In some embodiments, the register interface is configured to generate a physical memory address from the index stored in the register in order to read the statistic record from the array. In some embodiments, the write request held in the register of the register interface includes multiple data elements that correspond to different statistics. In some embodiments, multiple statistic records in the array of statistic records are updated in response to the multiple data elements in the write request.

In some embodiments, reading the statistic record according to write request may include reading multiple adjacent statistic records in the array in the same read. In some embodiments, the write request includes multiple data elements that correspond to different statistics. In some embodiments, multiple statistic records in the array of statistic records are updated in response to the multiple data elements in the write request.

In some embodiments, writing the updated statistic to the statistic record may include writing updated statistics for multiple adjacent statistic records to the array in the same write. Embodiments may also include a processing element and a bus that connects the processing element to the register interface. In some embodiments, the write request is received on the bus from the processing element. In some embodiments, the update logic is configured to add a value of the data element to a value in the statistic record.

In some embodiments, the register interface includes a write request buffer to buffer multiple write requests. In some embodiments, the register interface is configured to process multiple write requests corresponding to the same statistic record in the array serially. In some embodiments, the register interface includes a write request buffer to buffer multiple write requests directed to the same statistic record. In some embodiments, the update logic is further configured to perform the statistic updates in a batch process before the updated statistic is written back to the array of statistic records that are stored in the RAM.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

Figure 1:
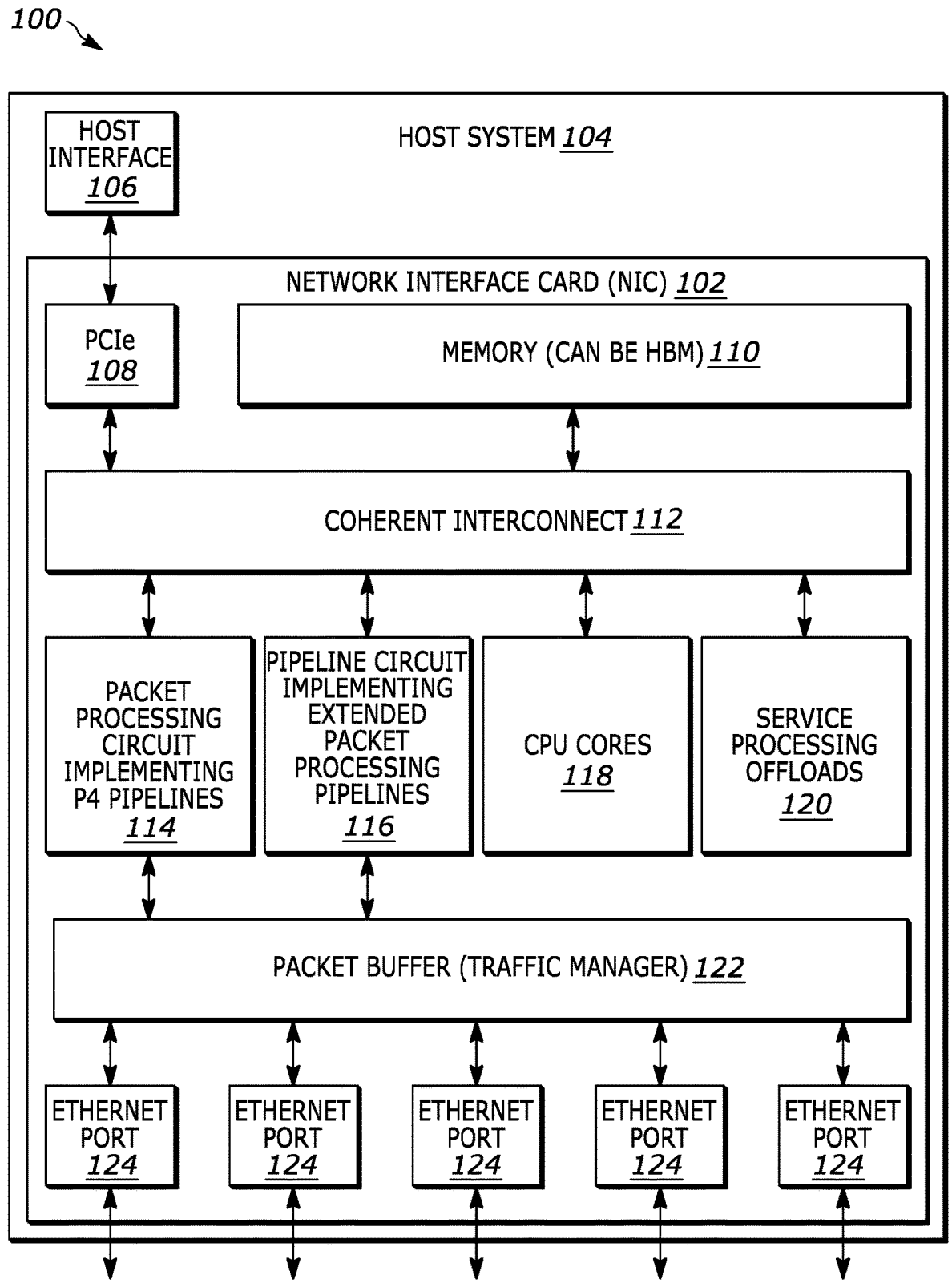
FIG. 1 is a high-level diagram of an I/O system in the form of a network interface card (NIC) in which the hardware-based statistics management techniques can be implemented.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Network processing hardware (e.g., I/O systems) and processing elements such as CPUs frequently desire to increment statistic counters, which track statistics such as packet count and total bytes count, event count (e.g., packet drop events or error events), histograms such as packet distribution, and timestamps such as packet arrival time and request latency. Typically, a statistics update requires a processing element to read a statistic record from memory, to apply an update to the statistic according to an algorithm, and to write the updated statistic back to the memory. Statistics, such as fine grained counters on packets and/or bytes, may be used to charge customers on a per usage basis, or may be used to implement service level agreements (SLAs). Such a statistic update process consumes considerable resources of the processing element as reading from and writing to the memory can be time and resource intensive operations, which can become a drag on the performance of the processing element, especially in a high bandwidth I/O device. An additional challenge to statistics updates may occur when multiple processing elements attempt to update the same statistic record at the same time, which can create a race condition in the system. Some conventional approaches to managing statistics in high bandwidth I/O devices have relied on using customized memory circuits to speed the update process, however, such customized memory circuits tend to be expensive and difficult to scale.

In accordance with an embodiment of the invention, a technique for managing statistics in an I/O system utilizes a register interface and an array of statistic records that is stored in memory (e.g., general purpose memory such as DDR) to implement hardware-based statistics management that is both highly flexible and massively scalable while conserving processor/CPU cycles as compared to conventional statistics management techniques. In particular, a method for statistic management involves reading a statistic record from an array of statistic records according to a write request that is held in a register of a register interface, wherein the write request includes a data element and wherein the array of statistic records is stored in RAM, performing a statistic update operation in response to the write request to generate an updated statistic, wherein performing the statistic update operation involves executing an operation using the data element included with the write request that is held in the register interface and the statistic record that is read from the RAM, and writing the updated statistic to the statistic record in the array of statistic records that is stored in the RAM. Using such a technique, a statistic update can be implemented in response to the issuance of a single write instruction from a processing element. Therefore, the processing element does not have to read a statistic record from a memory, update the statistic record (e.g., execute an add operation), and then write the updated statistic back to the memory. Rather, the processing element simply issues a single write request and thus, from the perspective of the processing element, a statistic update involves issuing only a single write request, thereby achieving an "atomic" update of a statistic record. Additionally, the processing element does not need physical resources such as read response buffers since the processing element does not implement a read operation. Because the array of statistic records is accessed and updated through a hardware register interface, the statistic update process does not consume CPU resources and a large number of statistic records can be uniquely managed in general purpose memory such as DDR, with a wide range of feature availability. Additionally, statistics updates can be initiated by multiple different processing elements within an I/O system using the same technique.

FIG. 1 is a high-level diagram of an I/O system 100 in the form of a network interface card (NIC) 102 in which the hardware-based statistics management techniques can be implemented. The NIC can be configured for operation within a host system 104, which can be a general-purpose computer with a host interface 106 such as a PCIe interface. The NIC can have a PCIe interface 108 through which the NIC can communicate with the host system. The NIC can also include a memory 110, a coherent interconnect 112, a packet processing circuit implementing, for example, P4 pipelines 114, a pipeline circuit 116 implementing extended packet processing pipelines (also called P4+ pipelines), CPU cores 118, service processing offloads 120, a packet buffer 122, and physical I/O ports, such as Ethernet ports 124. In an embodiment, the P4 pipelines are configured via a domain-specific language that is currently defined in the "P4$_{16}$ Language Specification," version 1.2.0, as published by the P4 Language Consortium on Oct. 23, 2019.

The memory 110 of the NIC 102 can include memory for running Linux or some other operating system, memory for storing data structures such as flow tables, statistics, and other analytics, and memory for providing buffering resources for advanced features including TCP termination and proxy, deep packet inspection, and storage offloads. The memory may include a high bandwidth module (HBM) that may support, for example, 4 GB capacity, 8 GB capacity, or some other capacity depending on package and HBM.

In an embodiment, the CPU cores 118 are general purpose processor cores, such as ARM processor cores, Microprocessor without Interlocked Pipeline Stages (MIPS) processor cores, and/or x86 processor cores, as is known in the field. In an embodiment, each CPU core includes a memory interface, an ALU, a register bank, an instruction fetch unit, and an instruction decoder, which are configured to execute instructions independently of the other CPU cores. In an embodiment, the CPU cores are Reduced Instruction Set Computers (RISC) CPU cores that are programmable using a general-purpose programming language such as C. The service processing offloads 120 are specialized hardware modules purposely optimized to handle specific tasks at wire speed, such as cryptographic functions, compression/decompression, etc. The packet buffer 122 can act as a central on-chip packet switch that delivers packets from the network interfaces 124 to packet processing elements of the NIC 102 and vice-versa.

Memory transactions in the NIC 102, including host memory, on board memory, and registers may be connected via the coherent interconnect 112. In one non-limiting example, the coherent interconnect can be provided by a network on a chip (NOC) "IP core". Semiconductor chip designers may license and use prequalified IP cores within their designs. Prequalified IP cores may be available from third parties for inclusion in IC devices produced using certain semiconductor fabrication processes. A number of vendors provide NOC IP cores. The NOC may provide cache coherent interconnect between NOC masters and slaves, including the packet processing circuit implementing P4 pipelines 114, the pipeline circuit implementing extended packet processing pipelines 116, the CPU cores 118, and the PCIe 108. The coherent interface provides a bridge between the control hardware (referred to generally herein as the control hardware space) and the memory (referred to generally herein as the memory space) of the I/O system 100. The coherent interconnect may distribute memory transactions across a plurality of memory interfaces using a programmable hash algorithm. Traffic targeting the memory may be stored in a NOC cache (e.g., 1 MB cache). The NOC cache may be kept coherent with the CPU core caches. The NOC cache may be used to aggregate memory write transactions which may be smaller than the cache line (e.g., size of 64 bytes) of an HBM.

Figure 2:
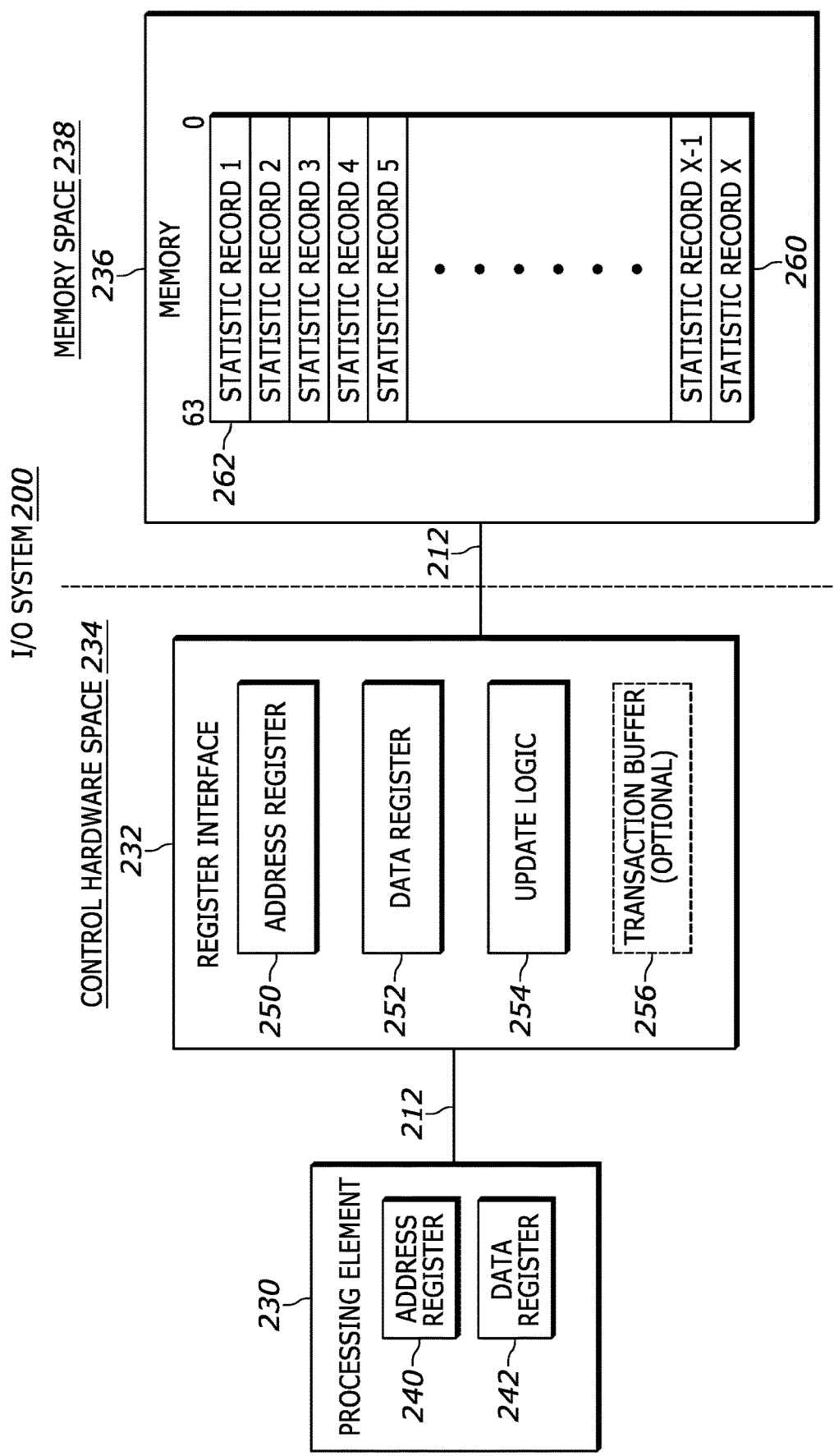
FIG. 2 depicts a specific example of an I/O system that is configured to implement hardware-based statistics management in accordance with an embodiment of the invention.

FIG. 2 depicts a specific example of an I/O system 200 that is configured to implement hardware-based statistics management in accordance with an embodiment of the invention. In an embodiment, the I/O system 200 is an I/O device, such as the NIC 102 described with reference to FIG. 1, although the I/O system 200 may be a component of some other device or a component of a broader computing system. As depicted in FIG. 2, the I/O system 200 includes a processing element 230 and a register interface 232 in the control hardware space 234 of the I/O system and memory 236 (e.g., DDR) in the memory space 238 of the I/O system. As is described in more detail below, an array of statistic records is stored in the memory for statistics management. In an embodiment, elements of the I/O system are integrated onto the same IC device, e.g., such as a "system-on-chip" or "SoC." In other embodiments, some elements of the I/O system are connected to each other on a printed circuit board (PCB). In an embodiment, the processing element 230 may be a CPU (e.g., CPU cores 118, FIG. 1) or a data plane processing element (e.g., packet processing circuits 114 and 116 from FIG. 1), or some other processing element, as is known in the field. Although not shown in FIG. 2, a processing element may include a memory interface, an ALU, a register bank, an instruction fetch unit, and an instruction decoder, which are configured to execute instructions. The processing element may also include internal registers that can only be used by the processing element (e.g., instruction registers, memory address registers, and memory buffer registers) and user-accessible registers such as address registers and data registers that can be used by external components and/or software as is known in the field. A user-accessible address register 240 and a user-accessible data register 242 of the processing element are shown in FIG. 2. Although only a single processing element is shown in FIG. 2, the I/O system will typically include more than one processing element that has access to the register interface 232 and to the memory 236.

The register interface 232 in the control hardware space 234 of the I/O system 200 is configured to implement operations related to statistics management as is described below. The register interface includes an address register 250, a data register 252, and update logic 254. In an embodiment, the register interface is integrated onto the same IC device as the processing element 230 and the address register 250 and data register 252 are used to hold components of write requests. For example, with regard to the write requests, the address register 250 holds an index (e.g., atomic_add_index) that is used to identify a statistic record that is stored in the memory and the data register 252 holds a data element (e.g., data_element) that is used to update the identified statistic record that is stored in the memory 236. In an embodiment, the address and data registers, 250 and 252, are 64-bit hardware registers that are implemented in hardware circuits such as flip-flop circuits as is known in the field. Although the address and data registers are described a 64-bit registers, the address and data registers could be of a different size, such as, for example, 32-bit registers. In an embodiment, the address and data registers of the register interface are embodied as a small amount of fast storage that is external to the processing element 230 and that is distinct from the user-accessible address and data registers 240 and 242, which are incorporated into the processing element 230, e.g., as part of an intellectual property (IP) block that is often provided by third-party CPU providers. Although not shown in FIG. 2, the register interface may include a first set of address and data registers for receiving write requests from the processing element and a second set of address and data registers for returning information related to write requests (e.g., a write response). For example, a write response may involve a simple "write done" or "write error" indicator. The register interface may include additional registers (e.g., a transaction buffer 256) to buffer multiple write requests. The register interface may also have access to clock information such as a system clock of the I/O system. The clock information may be used to generate timestamps, which may be used for time-related statistics.

In an embodiment, the address and data registers 250 and 252 of the register interface 232 are connected to the corresponding address and data registers, 240 and 242, within the processing element 230 via a bus 212 (e.g., the coherent interconnect 112 as described above with reference to FIG. 1). In an embodiment, the coherent interconnect that interconnects the processing element 230 and the register interface 232 includes circuits that steer write requests from the processing element to the register interface based on an address in the write requests.

In an embodiment, the update logic 254 of the register interface 232 is implemented in hardware circuits that interact with the address register 250 and the data register 252 and with data from an array of statistic records 260 that is stored in the memory 236 (e.g., DDR) to service write requests received from the processing element 230. For example, the update logic 254 includes hardware circuits configured to implement finite state machines (FSMs) that perform statistic update operations that include reading statistic records from the memory, updating statistics to generate updated statistics, and then writing the updated statistics back to the memory. In an embodiment, the update logic is implemented as a pipeline machine, which includes a stage for decoding write requests, a stage for reading statistic records from the array of statistic records that are stored in the memory, a stage for updating statistics (e.g., executing add operations), and a stage for writing updated statistics back to the statistic records in the array of statistic records that are stored in the memory. Operations of the register interface are described in more detail below with reference to FIGS. 5A-5C.

Turning now to the memory 236 of the computing system 200, in an embodiment, the memory is general purpose memory such as RAM. For example, the memory is double-data rate synchronous dynamic RAM (DDR-SDRAM or simply DDR), although the RAM may be static RAM (SRAM), dynamic RAM (DRAM), synchronous DRAM (SDRAM), or a combination thereof. As illustrated in FIG. 2, the memory stores the array of statistic records 260. The array of statistic records includes individual statistic records 262 that are configured as described in more detail below with reference to FIG. 3. In general, a statistic record includes, at a minimum, a data element that corresponds to a statistic that is maintained in the memory. For example, data elements may include data that is used to maintain a statistic such as packet count, total bytes count, event count, histograms such as packet distribution, and timestamps such as packet arrival time and request latency. In an embodiment, the statistic records are 64-bits (8-bytes) each and are 8-byte address aligned.

Figure 3:
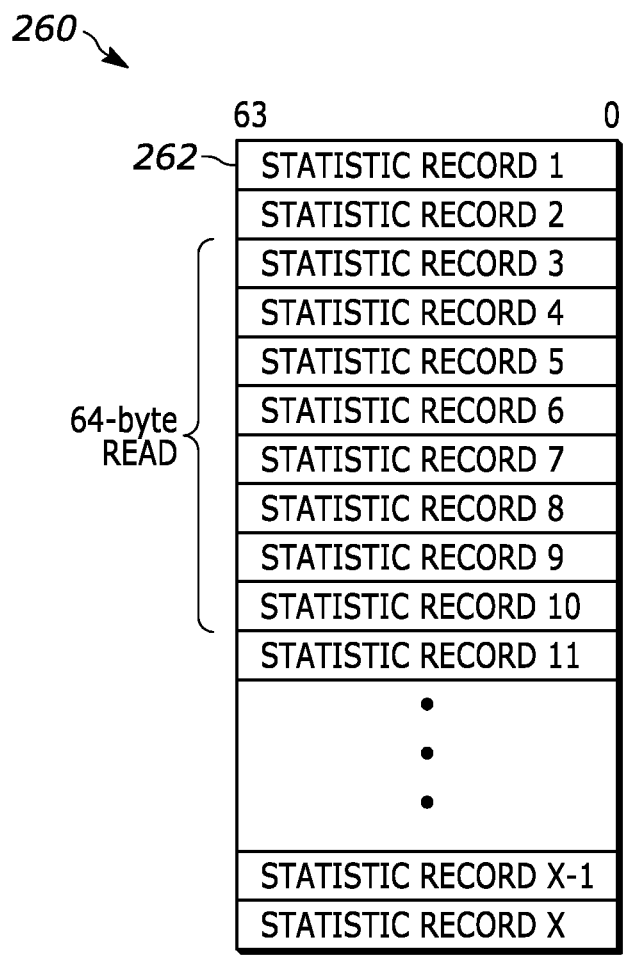
FIG. 3 depicts the array of statistic records from FIG. 2 that is stored in memory such as general purpose DDR memory.

FIG. 3 depicts the array of statistic records 260 from FIG. 2 that is stored in memory (not shown) such as general purpose DDR memory. In the embodiment of FIG. 3, each statistic record 262 is 64-bits and the statistic records are arranged in an array in which each record is 8-byte address aligned. In an embodiment, the statistic records hold a value representative of a statistic. For example, the statistic may be a statistic such as a packet count, a total bytes count, an event count, a histogram of packet distribution, a timestamp such as packet arrival time, and a request latency. In an embodiment, the data value added to each statistic record upon an update is represented in binary by a field of bits that is smaller than 64-bits. However, in an embodiment, each statistic record is maintained as a full 64-bit value in little endian format in the memory. Although in one embodiment, the entire 64-bit field is reserved for the statistic, in other embodiments, the statistic record may include a field or fields for metadata, e.g., flags that include data about the statistic and/or about the statistic record. The number of statistic records in the array of statistic records is implementation specific. In an embodiment, the address space allows for $2^{24}$ (e.g., 16 MM) unique addresses and therefore $2^{24}$ (e.g., 16 MM) uniquely addressable corresponding statistic records. Because the statistic records are stored in general purpose memory, such as DDR, a large array of statistic records can be maintained at a low cost relative to other specialized types of memory.

Figure 4:
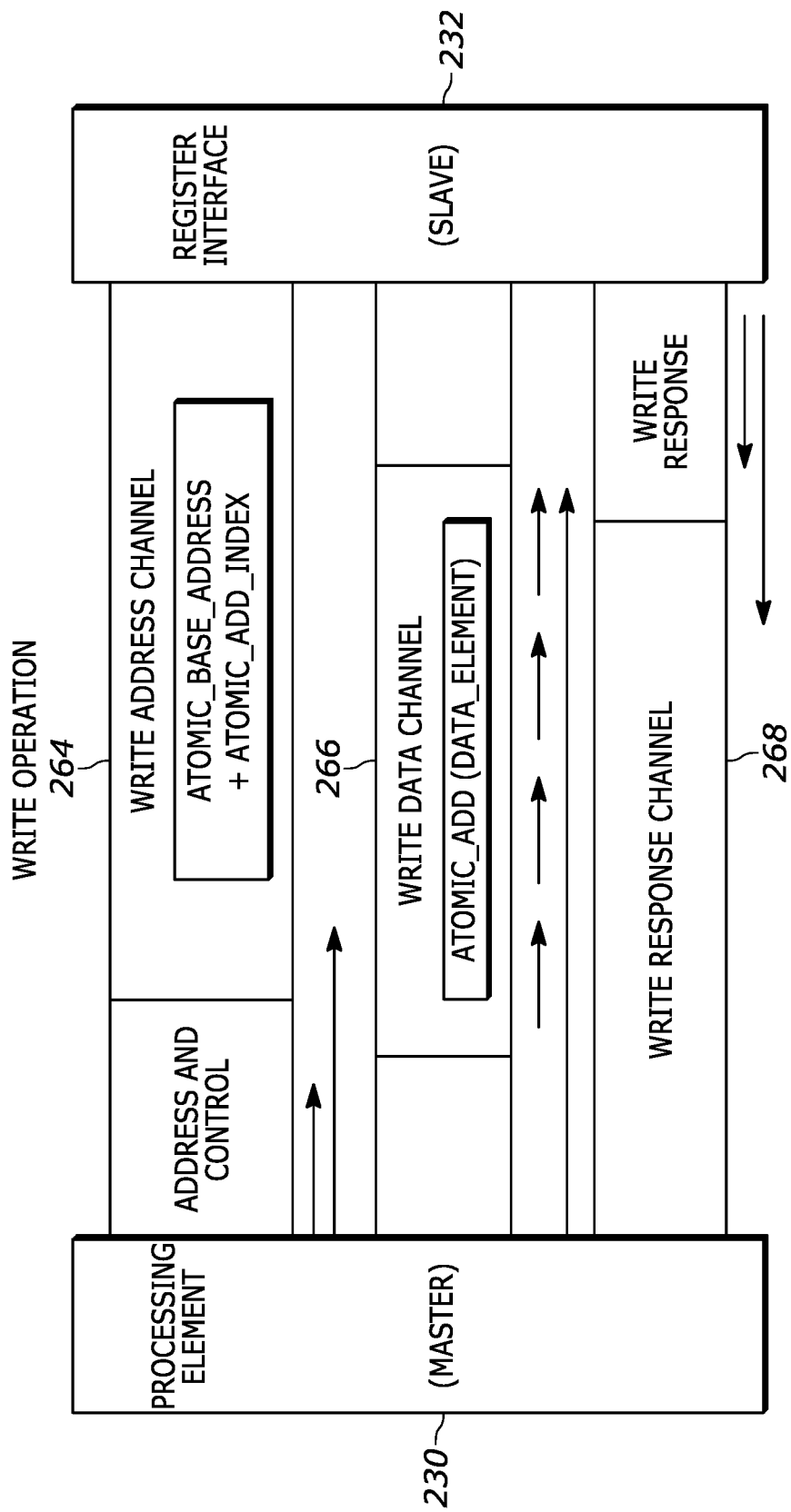
FIG. 4 illustrates an example data exchange that is involved in a write operation between the processing element and the register interface of FIG. 2.

An example of implementing a statistic update via a single write request from a processing element is now described with reference to FIGS. 4 and 5A-5C. FIG. 4 illustrates an example data exchange that is involved in a write operation between, for example, the processing element 230 and the register interface 232 of FIG. 2. In example of FIG. 4, the processing element 230 is the master and the register interface 232 is the slave and the processing element initiates the write operation via a write request. As illustrated in FIG. 4, a write request, which includes a base address of the array of statistic records 260 (atomic_base_address) and statistic record identification information, e.g., an index (atomic_add_index), is communicated from the processing element to the register interface via a write address channel 264 and corresponding data that is to be used to update a statistic (e.g., a data element corresponding to the statistic) is provided from the processing element to the register interface via a write data channel 266. As illustrated in FIG. 4, the write data channel is used to carry a portion of the write request referred to herein as "atomic_add," which at least includes a data element referred to as the "data_element." Reporting of an outcome of the write operation (e.g., a write response) may be communicated via a write response channel 268.

Figure 5A:
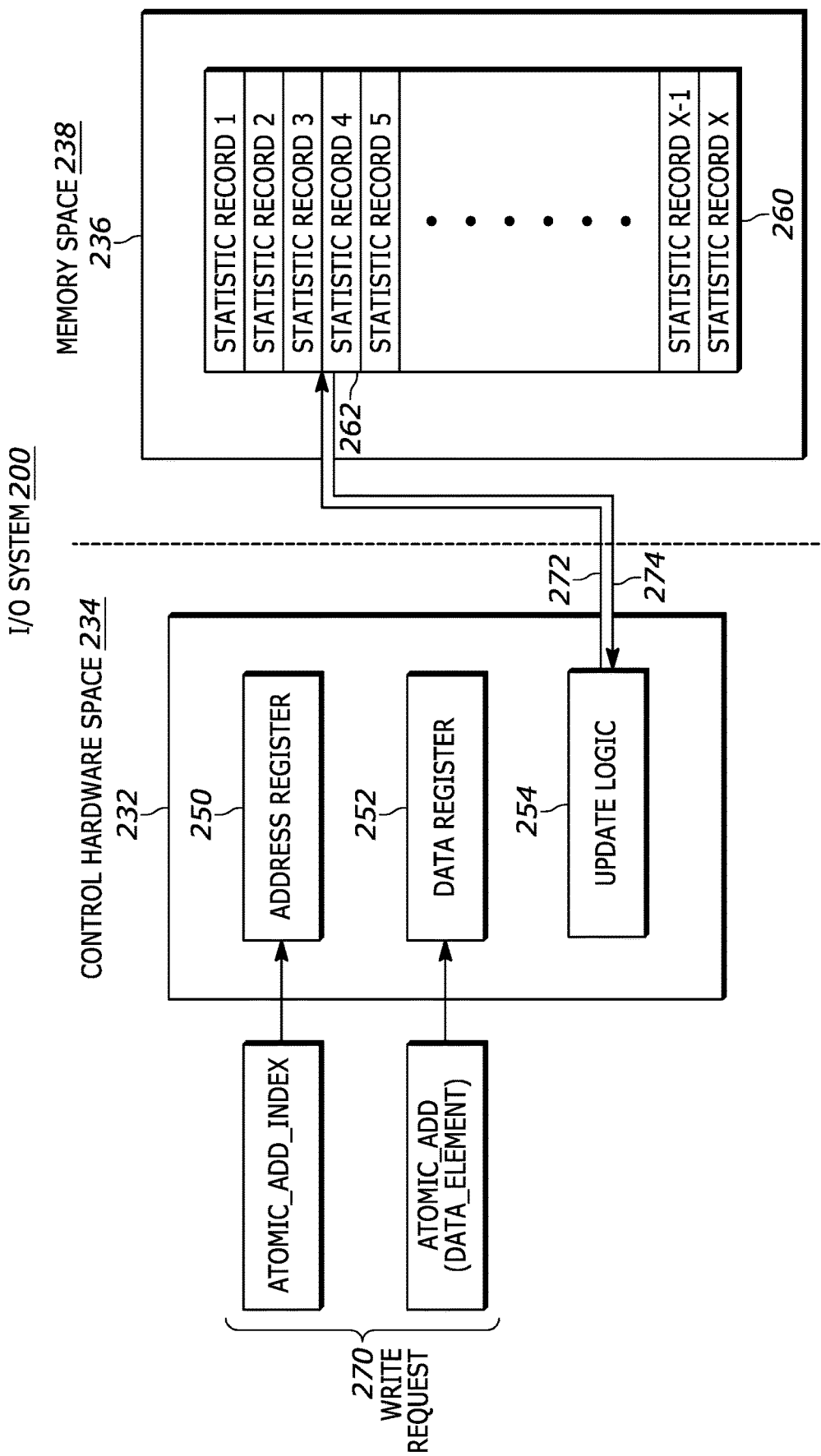
FIGS. 5A and 5B illustrate operations associated with a write request that occur in the control hardware space and the memory space of the I/O system.
Figure 5B:
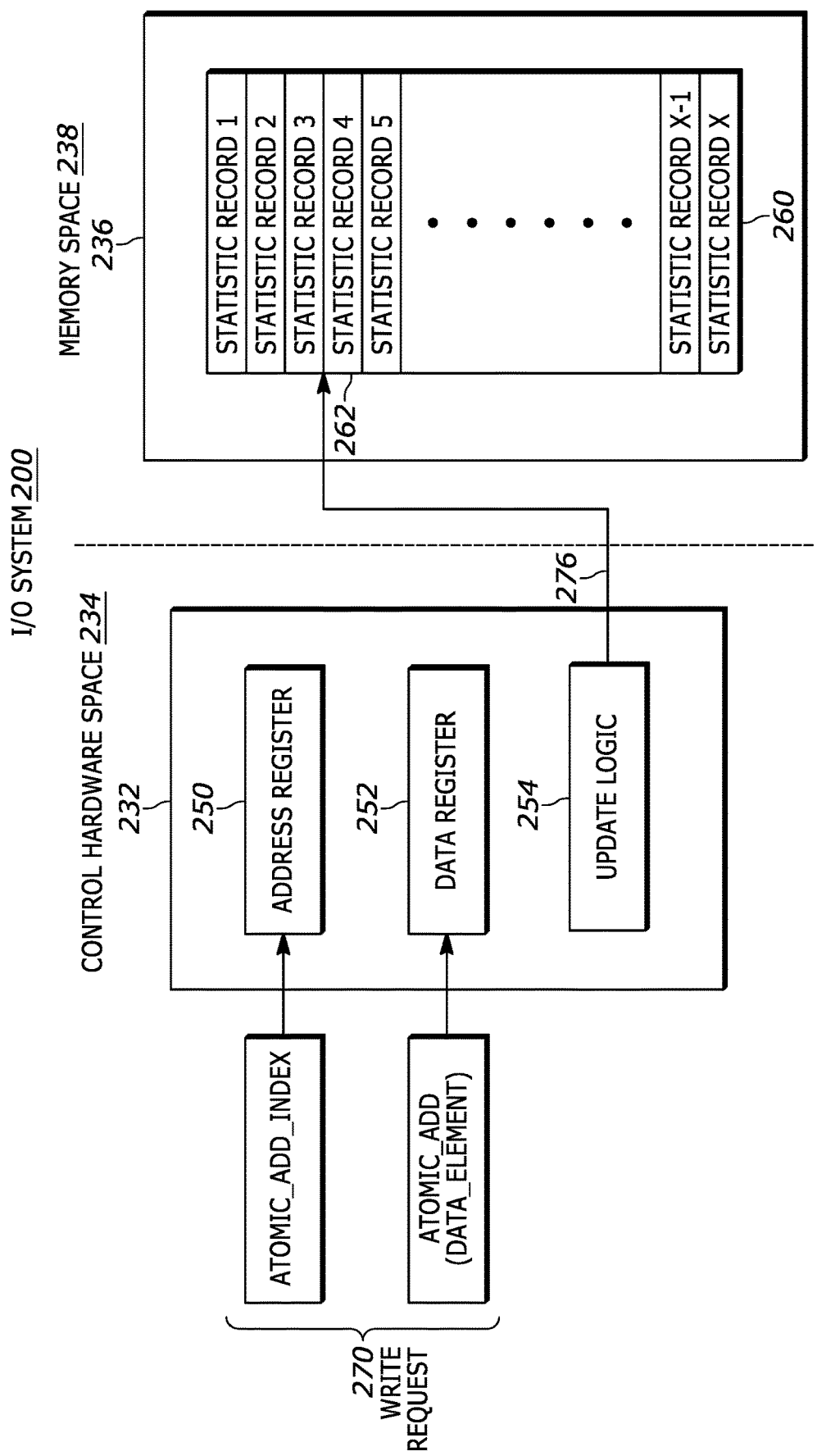

FIGS. 5A and 5B illustrate operations associated with a write request that occur in the control hardware space 234 and the memory space 238 of the I/O system 200. For example, the operations performed by the register interface 232 in response to a write request from a processing element include receiving a write request for a statistic update, where the write request includes an index (e.g., atomic_add_index) for use in generating the physical memory address of the statistic record in the array of statistic records 260, and then reading the statistic record from the array according to the generated physical memory address. With reference now to FIG. 5A, a write request 270 is received at the address register 250 of the register interface and at the data register 252 of the register interface. The data received at the address register is a first binary value that includes a base address and an index (e.g., atomic_base_address+atomic_add_index), in which the index corresponds to a particular statistic record. The data received at the data register is a second binary value that includes a data element (e.g., data_element) that is used to update the statistic. The index in the address register is used by the register interface to read the corresponding statistic record from the array of statistic records. For example, the register interface uses the index to generate a physical memory address of the statistic record in the memory. The identification of the physical memory address of the statistic record 262 in the memory is illustrated in FIG. 5A by arrow 272 and the reading of the statistic record from the memory is illustrated in FIG. 5A by arrow 274. Once the statistic record is read from the array of statistic records, an update operation is executed by the update logic. For example, the update logic executes an add operation in which the value of the data element (e.g., data_element) in the data register is added to the value of the data element that was read from the statistic record 262. For example, the add operation involves adding a packet to an existing packet count, adding bytes to an existing total bytes count, adding an event to an event count, adding a value to a bucket of a histogram, updating a timestamp, or updating a request latency. Once an updated statistic is generated from the update operation, the updated statistic is written back to the statistic record in the memory. With reference now to FIG. 5B, the writing of the updated statistic to the statistic record in the array of statistic records is illustrated by arrow 276. In an embodiment, once the write to the memory is complete, the register interface may acknowledge to the processing element that the write was completed (e.g., write_response). In an embodiment, the write may be acknowledged to the processing element as soon as the write request arrives at the register interface and in another embodiment, the write may be acknowledged to the processing element after the update operation is complete.

Figure 5C:
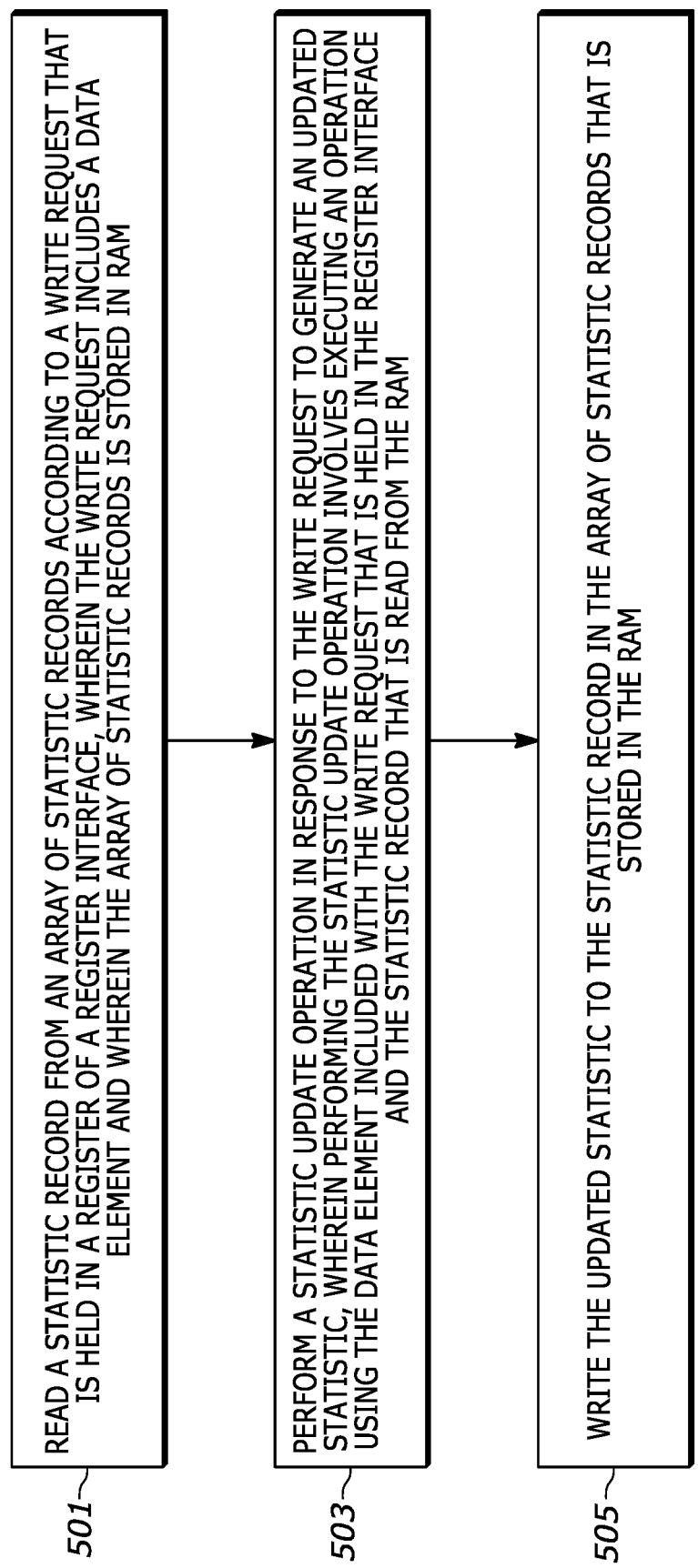
FIG. 5C is a process flow diagram of operations performed by the register interface to manage statistical data, such as statistical data that is maintained at an I/O device.

FIG. 5C is a process flow diagram of operations performed by the register interface to manage statistical data, such as statistical data that is maintained at an I/O device. At block 501, a statistic record is read from an array of statistic records according to a write request that is held in a register of a register interface, wherein the write request includes a data element and wherein the array of statistic records is stored in RAM. At block 503, a statistic update operation is performed in response to the write request to generate an updated statistic, wherein performing the statistic update operation involves executing an operation using the data element included with the write request that is held in the register interface and the statistic record that is read from the RAM. At block 503, the updated statistic is written to the statistic record in the array of statistic records that is stored in the RAM.

Thus, as described above, from the perspective of the processing element 230, a statistic update is implemented with the issuance of a single write instruction from the processing element. That is, the processing element does not have to read a statistic record from the memory 236, update the statistic record (e.g., execute an add operation), and then write the updated statistic back to the memory. Thus, from the perspective of the processing element, a statistic update involves issuing only a single write request, thereby achieving an "atomic" update of a statistic record from the perspective of the processing element.

Current high-speed memory systems include a high-speed data bus and have a multi-byte burst length. For example, some current high-speed memory systems have a 64-byte burst length, in which 64-bytes are read from the memory in a single read operation and written to the memory in a single write operation. Given a 64-byte burst length, eight 64-bit statistic records can be read from an array of statistic records in a single read. In fact, in a system with a 64-byte burst length, at least 64-bytes will typically be read from the memory in each read operation regardless of the number bytes that are desired. With reference back to FIG. 3 for example, a read starting at the address of statistic record 3 will include 64-bytes, which are composed of statistic record 3 through statistic record 10. Given that a memory system can read more than one statistic record in a single read, it has been realized that a single write request can be formatted to carry multiple data elements in the write request and then the multiple data elements in the write request can be used by the register interface to update multiple adjacent data records with a single read to the memory and a single write back to the memory, thereby achieving an "atomic" update of multiple statistic records.

Figure 6A:
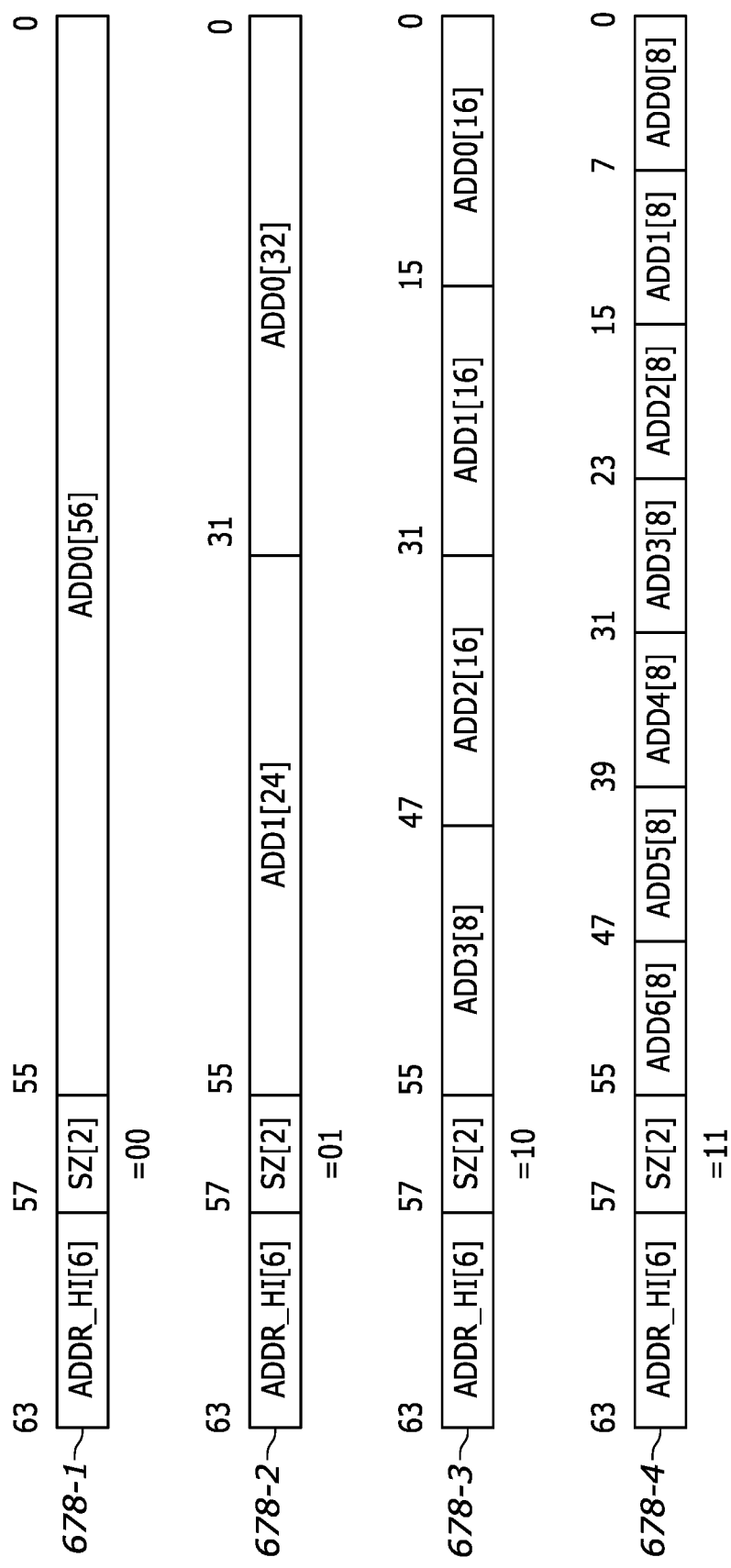
FIG. 6A illustrates an example of different formats of the data portion of a write request that can be used to atomically update statistics in 1, 2, 4, or 7 different statistic records.

As described above with reference to FIGS. 2-5C, a write request sent from the processing element 230 includes a data element (e.g., data_element) that gets delivered to the data register 252 in the register interface 232. In an embodiment, the write request can be formatted to include data elements for more than one statistic. For example, a single write request could be formatted to include data elements for 1, 2, 4, or 7 different statistics. FIG. 6A illustrates an example of different formats of the data portion (e.g., atomic_add) of a write request that can be used to atomically update statistics in 1, 2, 4, or 7 different statistic records. In particular, FIG. 6A illustrates four different formats of the data portion (e.g., atomic_add, which is 64-bits of data held in the data register of the register interface) of a write request in the case where the data portion includes 1, 2, 4, or 7 different data elements that are used to update corresponding statistics. From top to bottom, the data portion of the first write request 678-1 is configured with one data element and includes a 6-bit address field (ADDR_HI), a 2-bit size field (SZ), and a 56-bit data_element field (e.g., ADD0). In the example, address field (ADDR_HI) is a 6-bit field that holds an address that is used in part to identify a corresponding statistic record in the array of statistic records. As is described in more detail below, the 6-bit address field is used in conjunction with a 24-bit index (e.g., atomic_add_index) from the address portion of the write request to identify the physical memory address of the particular statistic record in the array of statistic records. The size field (SZ) is a 2-bit field that holds a value that indicates how many different data elements are included in the data portion of the write request. For example, the 2-bit size field indicates the number of different data elements as follows: 00=1 data element, 01=2 data elements, 10=4 data elements, and 11=7 data elements. In the case of the first format, the size field is set to "00," which indicates a single data element. Thus, the data element (ADD0) is a 56-bit field that holds a value that corresponds to the statistic that is being maintained in the statistic record.

The second write request 678-2 is similar to the first write request except that the size field is set to "01," which indicates that there are two different data elements included. As shown in FIG. 6A, the 56-bits of data are divided into a first data element (ADD0) of 32-bits and a second data element (ADD1) of 24-bits. The first data element (ADD0) corresponds to a first statistic and the second data element (ADD1) corresponds to a second statistic. As is described below, the two data elements can be used to update two different statistics held in two different statistic records in an update operation that is responsive to a single write request from a processing element and that requires only one read from the memory and one write back to the memory.

The third write request 678-3 is similar to the first and second write requests except that the size field is set to "10," which indicates that there are four different data elements included. As shown in FIG. 6A, the 56-bits of data are divided into a first data element (ADD0) of 16-bits, a second data element (ADD1) of 16-bits, a third data element (ADD2) of 16-bits, and a fourth data element (ADD3) of 8-bits. The first data element (ADD0) corresponds to a first statistic, the second data element (ADD1) corresponds to a second statistic, the third data element (ADD2) corresponds to a third statistic, and the fourth data element (ADD3) corresponds to a fourth statistic. The four data elements can be used to update four different statistics held in four different statistic records in an update operation that is responsive to a single write request from a processing element and that requires only one read from the memory and one write back to the memory.

The fourth write request 678-4 is similar to the first, second, and third write requests except that the size field is set to "11," which indicates that there are seven different data elements included. As shown in FIG. 6A, the 56-bits of data are divided into a first data element (ADD0) of 8-bits, a second data element (ADD1) of 8-bits, a third data element (ADD2) of 8-bits, a fourth data element (ADD3) of 8-bits, a fifth data element (ADD4) of 8-bits, a sixth data element (ADD5) of 8-bits, and a seventh data element (ADD6) of 8-bits. The first through seventh data elements (ADD0-ADD6) correspond to first through seventh statistics. The seven data elements can be used to update seven different statistics held in seven different statistic records in an update operation that is responsive to a single write request from a processing element and that requires only one read from the memory and one write back to the memory.

As explained above, a single memory read can include up to eight different statistic records, e.g., eight 64-bit statistic records for a total read of 64-bytes. Although eight different statistic records can be read in a single read operation, in the example described herein, a maximum of seven unique data elements are carried in a single write request. In other embodiments, the number of data elements carried in the same 56-bit field could be increased by decreasing the number of bits per data element. In the example described herein, the minimum size of the data element was selected to be 8-bits and therefore, the number of unique data elements was limited to seven. Additional variations can be envisioned if the write requests are comprised of more or less bits than described herein.

Figure 6B:
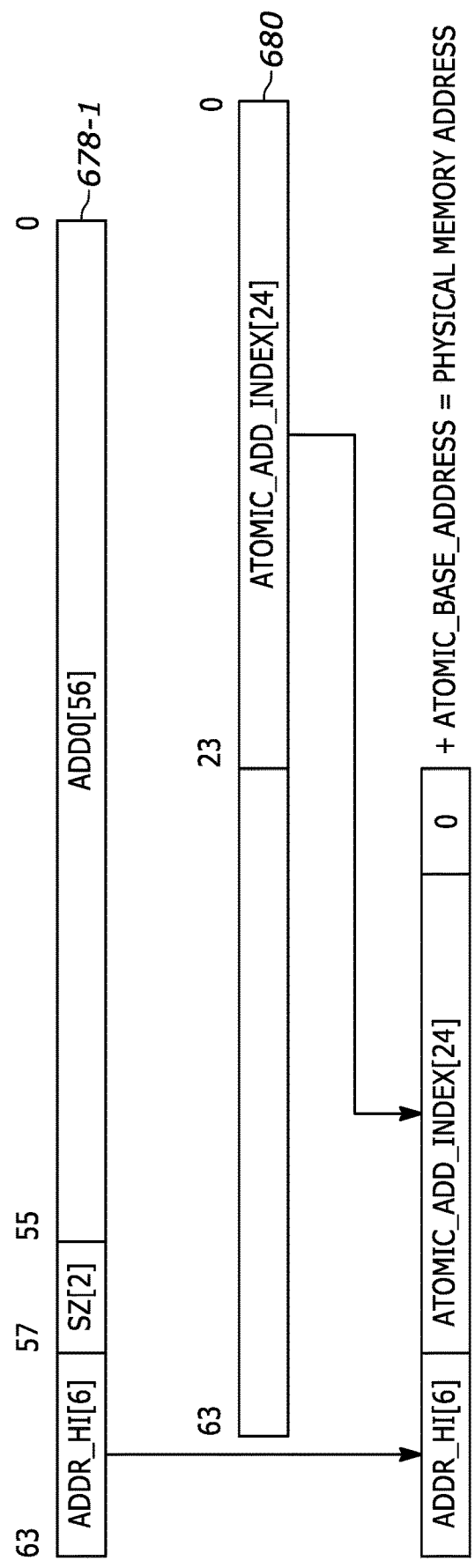
FIG. 6B illustrates an example of the generation of a physical memory address from information from the address register and from information from the data register.

As described above, the register interface 232 generates a physical memory address for a statistic record from the write request. In an embodiment, in order to address a large memory space, the register interface uses a field from the address register 250 in conjunction with a field from the data register 252 to generate the address in physical memory at which the desired statistic record is stored. FIG. 6B illustrates an example of the generation of a physical memory address from information 678-1 from the address register and from information 680 from the data register. As illustrated in FIG. 6B, the 24-bit value (e.g., atomic_add_index) from the address register and the 6-bit value from the high address field (ADDR_HI) of the data register are used to generate the physical memory address of the statistic record in the array of statistic records that are stored in the memory. As illustrated in the example of FIG. 6B, the physical memory address in the memory (e.g., DDR) is calculated as:

Address = {atomic_add[63:58], atomic_add_index[23:0], 3'd0} + atomic_base_address<<28)

As expressed above, the upper 6 bits (ADDR_HI or atomic_add[63:58]) of the physical memory address come from the data register and the lower address bits of the physical memory address come from the address register and from a base address (e.g., atomic_base_address [9-bits] shifted by 28 bits) that is added to allow the array of statistic records to start at any 256 MB boundary within the memory, e.g., within the DDR. In an embodiment, the DDR starts at 2 GB in the system memory map and therefore, the atomic_base_address (e.g., atomic_base_address) is set to reflect the 2 GB start address.

In an embodiment, example update operations (e.g., add operations) corresponding to the four different data field formats are represented as:

atomic_add[57:56] (SZ[2]), the size of the atomic add operation:
00: Single counter add
   *Address += atomic_add[55:0]
01: Dual counter add
   *Address += atomic_add[31:0]

-continued

```
        *(Address + 8) +=atomic_add[55:32]
    10: Quad counter add,
        *Address += atomic_add[15:0]
        *(Address + 8) +=atomic_add[31:16]
        *(Address + 16) +=atomic_add[47:32]
        *(Address + 24) +=atomic_add[55:48]
    11: Seven counter add,
        *Address += atomic_add[7:0]
        *(Address + 8) +=atomic_add[15:8]
        *(Address + 16) +=atomic_add[23:16]
        *(Address + 24) +=atomic_add[31:24]
        *(Address + 32) +=atomic_add[39:32]
        *(Address + 48) +=atomic_add[47:40]
        *(Address + 56) +=atomic_add[55:48]
```

In an embodiment, a value of "0" in a data element field is valid and will leave the corresponding statistic unchanged. Thus, while using a write request format with multiple different data elements, not all of the corresponding statistic records may be updated in response to the write request.

In an embodiment, write requests that include multiple data elements must be naturally aligned in address. In other words, for atomic_add[57:56] (size field):
  00: write to any counter OK;
  01: write to any even counter (index LSB is 0);
  10: write to any fourth counter (index LSBs are 2'b0); and
  11: write to any eighth counter (index LSBs are 3'b0).

As described herein, the generation of physical memory addresses is implemented in the register interface 232 of the I/O system 200. Implementing the physical memory address generation in the register interface centralizes the address generation function to a single place in the system, which makes the address generation process efficient to implement, control, and/or modify. Additionally, centralizing the address generation function to the register interface removes the burden of physical memory address generation from the processing elements, which may be heterogenous processing elements distributed throughout the I/O system, and which may require custom configuration for each instance.

Figure 7:
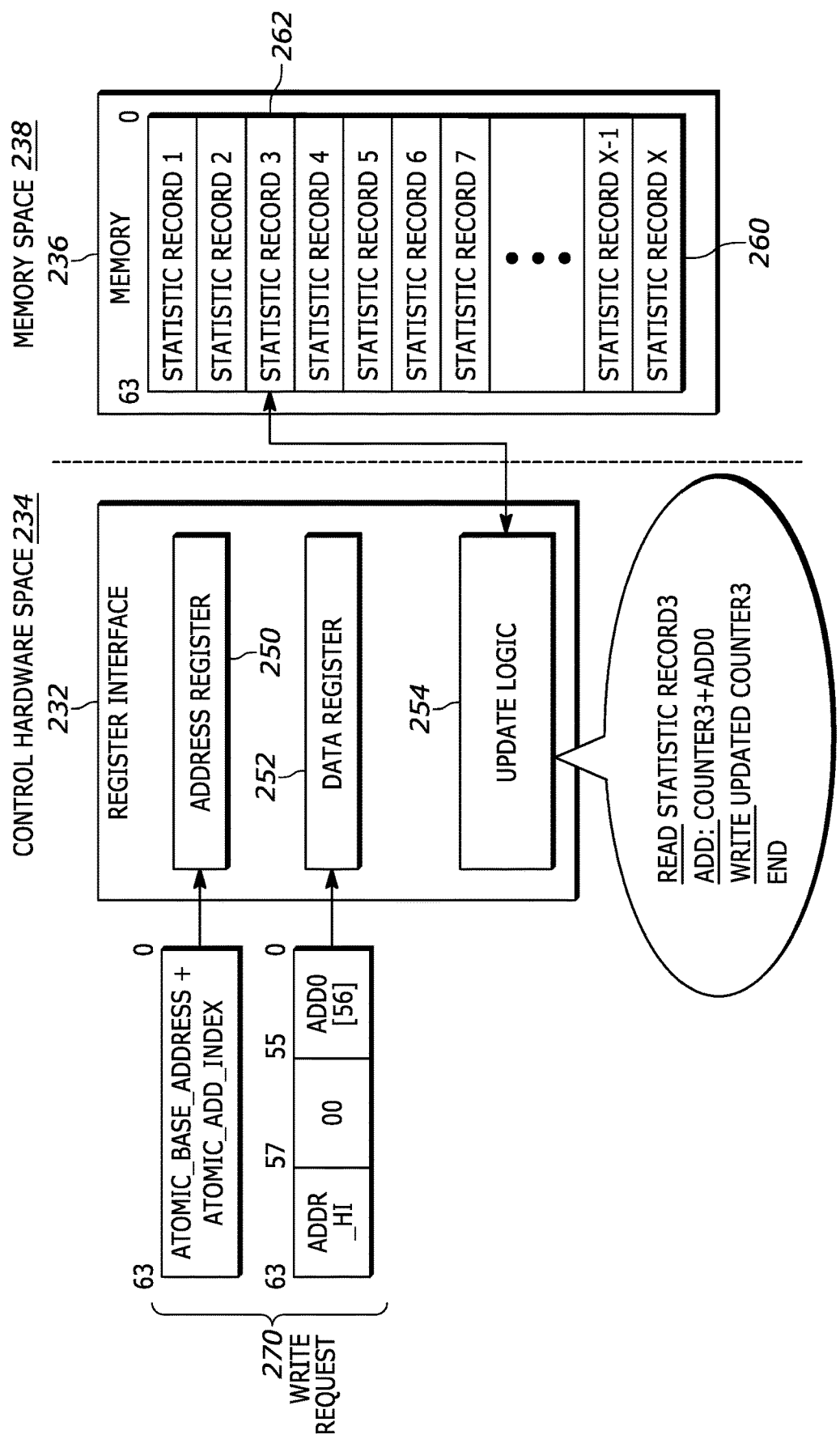
FIG. 7 illustrates an example of an update operation that utilizes the first write request format as shown in FIG. 6A to implement an update operation on a single statistic record.

FIG. 7 illustrates an example of an update operation that utilizes the first write request format 678-1 as shown in FIG. 6A to implement an update operation on a single statistic record. In the example of FIG. 7, a write request 270 is provided to the register interface 232 and statistic record 3 is read from the memory 236 based on the index (e.g., atomic_add_index) that is provided to the address register 250. Next, the data element (e.g., ADD0) that is provided to the data register 252 is added to the counter value (e.g., counter3) that is read from statistic record 3. As illustrated in FIG. 7, the update operation is expressed as: updated_counter3=counter3+ADD0. Next, the updated statistic is written back to the memory. In particular, the updated statistic (e.g., statistic record 3) is written back to the memory at the same location in the array as the statistic record was read from.

Figure 8:
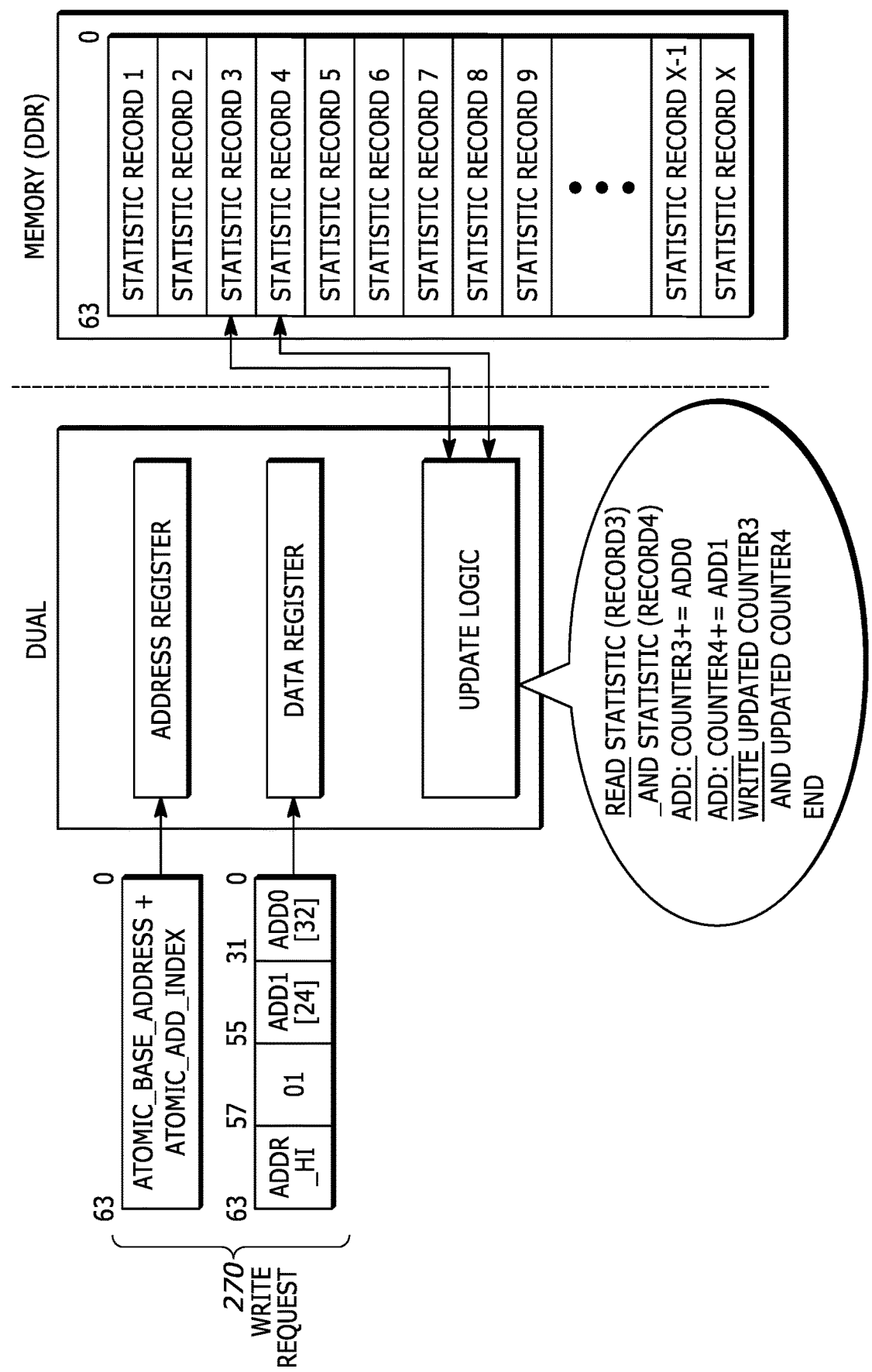
FIG. 8 illustrates an example of an update operation that utilizes the second write request format as shown in FIG. 6A to implement an update operation on two statistic records.

FIG. 8 illustrates an example of an update operation that utilizes the second write request format 678-2 as shown in FIG. 6A to implement an update operation on two statistic records. In the example of FIG. 8, a write request 270 is provided to the register interface 232 and statistic records 3 and 4 are read from the memory 236 in a single read operation based on the index (e.g., atomic_add_index) that is provided to the address register 250. Next, the data element (e.g., ADD0) that is provided to the data register 252 is added to the counter value (e.g., counter3) that is read from statistic record 3 and the data element (e.g., ADD1) that is also provided to the data register is added to the counter value (e.g., counter4) that is read from statistic record 4. As illustrated in FIG. 8, the update operation is expressed as: updated_counter3=counter3+ADD0 and updated_counter4=counter4+ADD1. Next, the updated statistics are written back to the memory. In particular, the updated statistics (e.g., statistic records 3 and 4) are written back to the memory at the same locations in the array as the statistic records were read from.

Figure 9A:
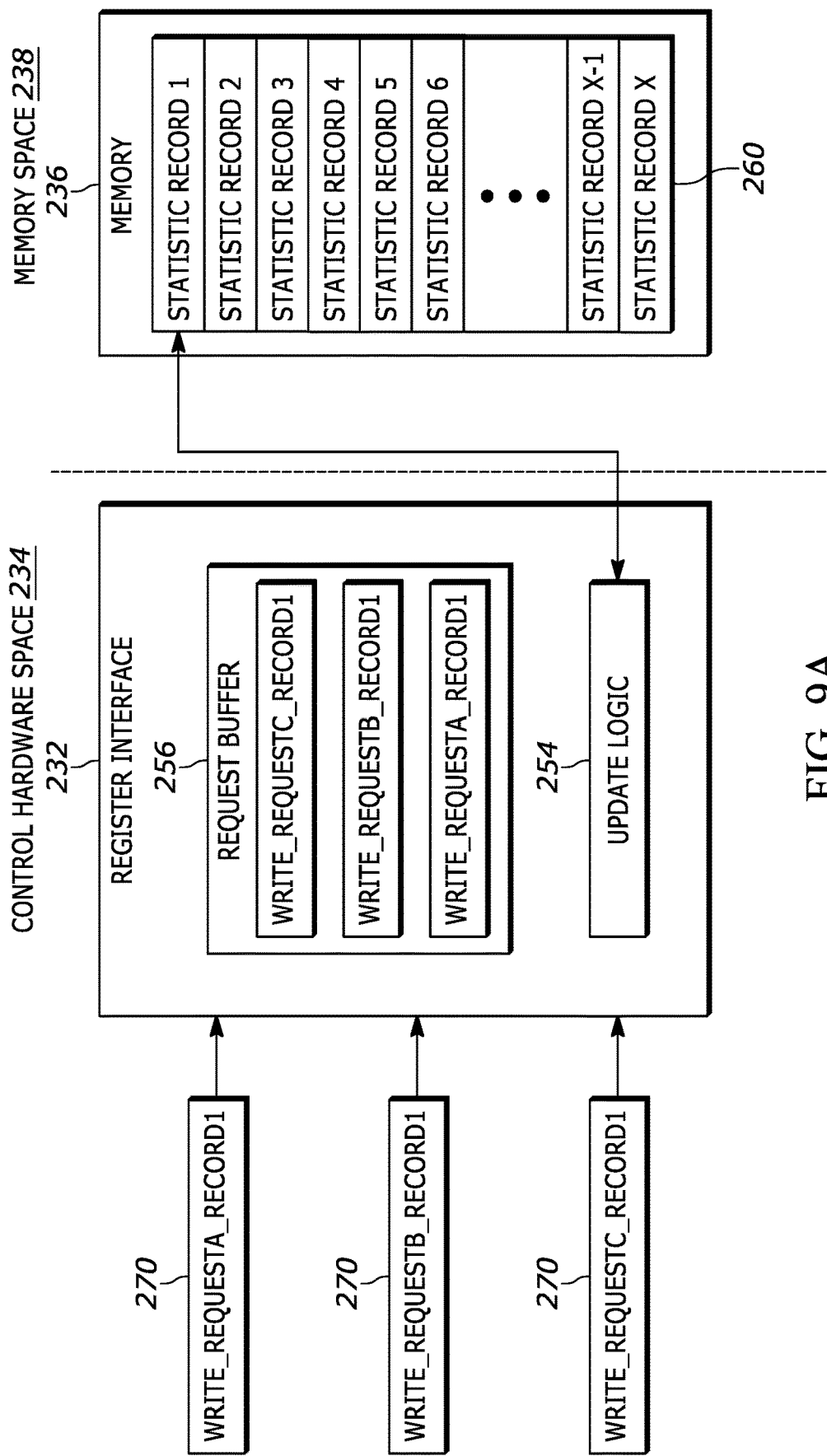
FIG. 9A illustrates multiple write requests, which correspond to the same statistic record, being sent to the register interface and buffered together in a request buffer.

In some cases, multiple write requests directed to the same statistic record may be sent to the register interface in rapid succession, e.g., in a burst of write requests. Thus, in some embodiments, the register interface includes a request buffer (see request buffer 256, FIG. 2) that is configured to buffer write requests so that a burst of write requests can be efficiently processed. In an embodiment, the request buffer may include multiple write request registers (e.g., including address and data registers) to store multiple write requests, for example, to buffer up to 64 write requests simultaneously. FIG. 9A illustrates multiple write requests (write_requestA_record1, write_requestB_record1, write_requestC_record1), which correspond to the same statistic record (e.g., statistic record 1), being sent to the register interface and buffered together in a request buffer. The write requests could be sent from the same processing element or the write requests could be sent more than on processing element.

Figure 9B:
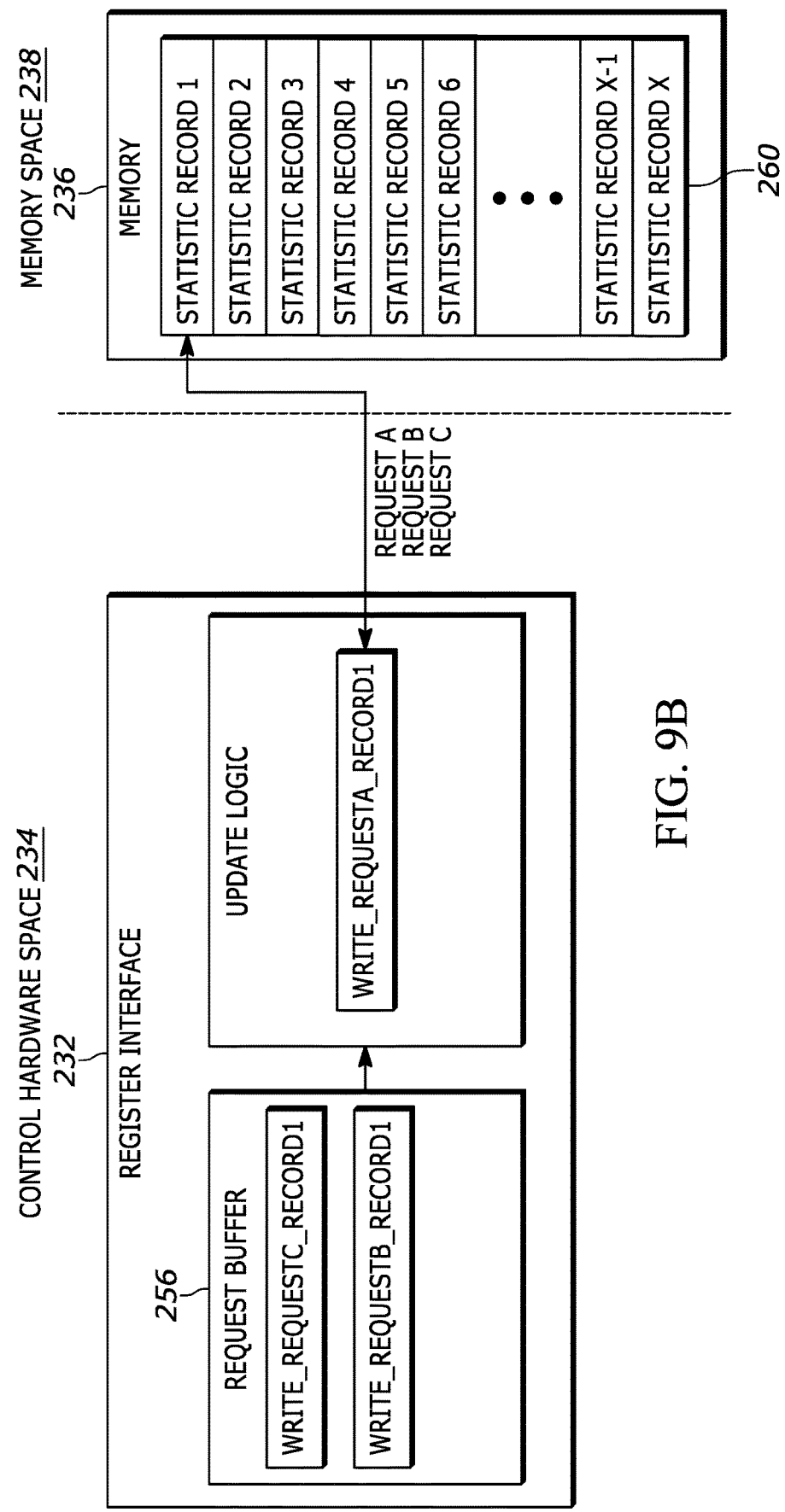
FIG. 9B illustrates the serial processing of buffered write requests corresponding to the same statistic record.

In one embodiment, multiple write requests to the same statistic record are buffered in the request buffer 256 and processed serially by the register interface. For example, FIG. 9B illustrates the serial processing of the write requests 270 corresponding to statistic record 1. As illustrated in FIG. 9B, "write_requestA_record1" is processed first by the update logic 254, which involves a memory read of statistic record 1, an update operation (e.g., an add operation), and a memory write operation to statistic record 1. Next, "write_requestB_record1" is processed by the update logic, which involves a memory read of statistic record 1, an update operation (e.g., an add operation), and a memory write operation to statistic record 1. Finally, "write_requestC_record1" is processed by the update logic, which involves a memory read of statistic record 1, an update operation (e.g., an add operation), and a memory write operation to statistic record 1. As described with reference to FIG. 9B, the serial processing of write requests involves three separate read/update/write operations to process all three write requests. Such serial processing ensures that a race condition is avoided amongst the three write requests.

Figure 9C:
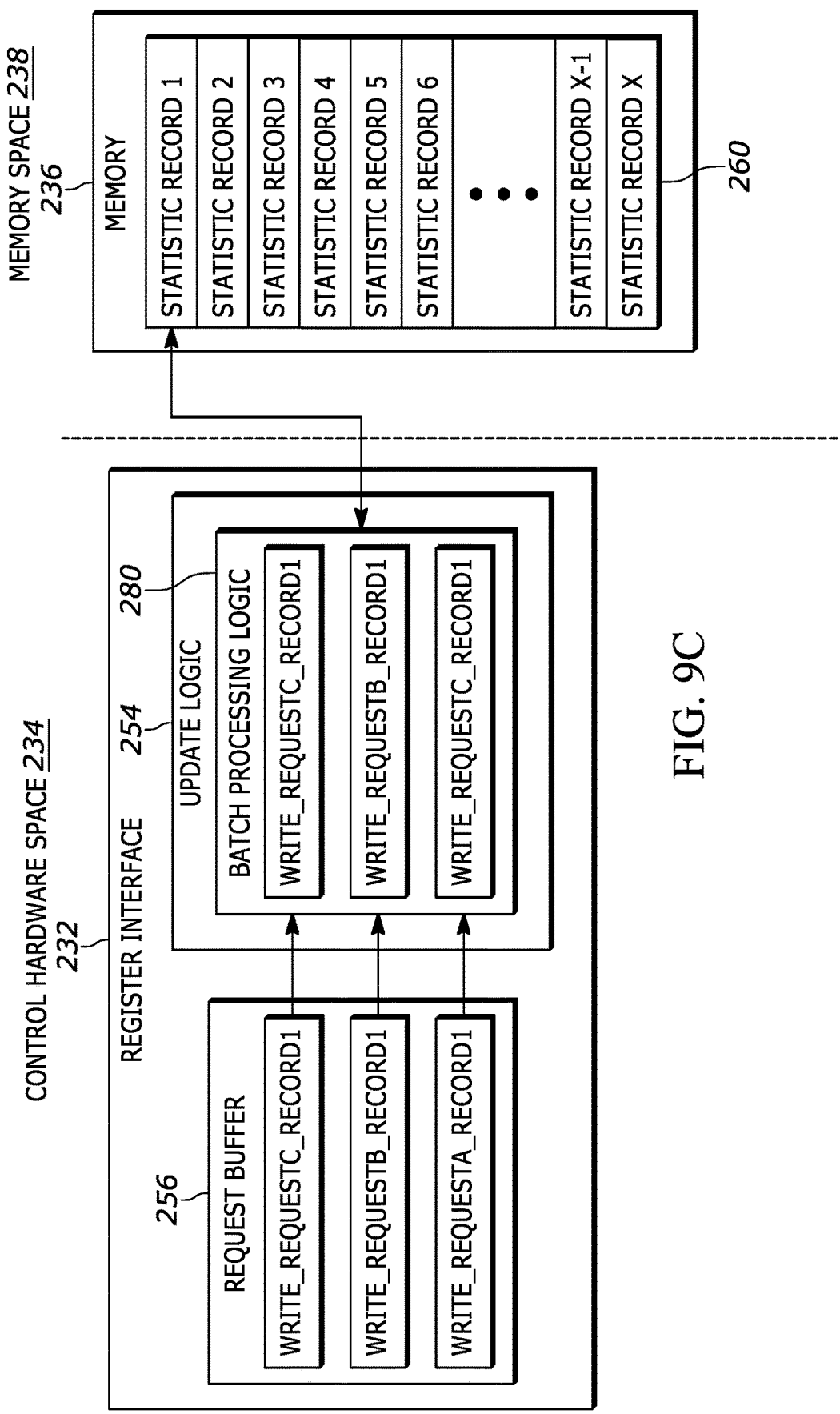
FIG. 9C illustrates the batch processing of buffered write requests corresponding to the same statistic record.

In another embodiment, multiple write requests to the same statistic record are buffered in the request buffer 256 and processed as a "batch" or in a "batch process." For example, FIG. 9C illustrates the batch processing of the write requests corresponding to statistic record 1. As illustrated in FIG. 9C, "write_requestA_record1," "write_requestB_record1," and "write_requestC_record1" are processed as a batch by batch processing logic 280 of the update logic 254. In an embodiment, batch processing involves one read of statistic record 1 from the memory, three successive update operations (e.g., add operations) of the statistic, and then one write back to the memory of statistic record 1. In an embodiment, the three consecutive add operations performed by the batch processing logic can be expressed as:

```
add1=(record1+write_requestA);
add2=write_requestB+(add1); and
add3=write_requestC+(add2).
```

The result of the three consecutive add operations (e.g., add3) is then written back to the memory. Although the processing of the three write requests involves three add operations, the processing of the three write requests requires only one read of statistic record 1 from the memory and only one write of the updated statistic back to the memory. Additionally, the batch processing of write requests as described herein ensures that a race condition is avoided amongst the three write requests. In an embodiment, the batch processing of write requests is triggered when there is more than one write request corresponding to the same statistic record buffered in the register interface.

Although the update logic is described above as implementing add operations, in other embodiments, the update logic may be configured to implement other statistic update operations in addition to, or instead of, add operations. For example, other update operations that may be implemented by the update logic may include:

1) an increment plus timestamp update operation: read one or more statistic records from the generated physical memory address, add one or more data elements that are write request; load the current timestamp from a time keeping resource; store all results plus timestamp back to memory.

2) a histogram update operation: determine which bucket the data is bound for based on a programmable profile; determine bucket statistics address based on bucket number plus calculated address; read current bucket value from memory; add write data; store back to memory.

3) a histogram plus timestamp update operation: a combination of operations 1) and 2), above.

4) an increment plus transaction latency update operation: read one or more statistic records from the calculated address, add one or more write elements from the write request; store the current timestamp for request transaction, or read and calculate the time difference for a response transaction; store calculated latency in the memory.

5) a moving average update operation: read statistic record from the memory; calculate an updated moving average using the data element in the write request; write the updated moving average back to the memory.

In an embodiment, the particular update operation that is executed by the update logic is determined in response to the index (e.g., atomic_add_index) that is included in the request. For example, the update logic is configured to associate particular indexes with particular update operations.

Although the examples described herein involve separate write address and write data channels (264 and 266, FIG. 4) and separate address and data registers, 250 and 252, in other embodiments, a write request can be communicated from a processing element in a single data word over a single write request channel to a single register in the register interface.

Some advantages of the hardware-based statistics management technique described herein may include, for example: 1) Processing elements update statistics with a posted write, which does not require read response buffers or tracking of multiple transactions; 2) Multiple statistics updates to the same or different records can be in flight at the same time from one or more processing elements. The atomic update mechanism will serialize and update memory accurately, without race conditions. For performance reasons, the atomic update system can detect multiple write requests to the same data index and collapse the write requests into a single memory read plus memory write transaction; 3) The atomic update mechanism can employ acceleration devices such as a transaction buffer or memory cache which are difficult and expensive to implement at the processing elements; 4) The internal transaction network of the system can be used to update many statistics in a single transaction, reducing the overall traffic on the internal bus resource; and 5) Processing elements write to the atomic update register array using only the statistics index as an addressing parameter. The atomic update mechanism can be programmed with the statistic data structure offset in memory, centralizing this parameter and removing the burden of more complex addressing from individual processing elements.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A method for managing statistical data at an input/output (I/O) system, the method comprising:
   reading a statistic record from an array of statistic records according to a write request that is held in a register of a register interface, wherein the write request includes a data element and wherein the array of statistic records is stored in RAM;
   performing a statistic update operation in response to the write request to generate an updated statistic, wherein performing the statistic update operation involves executing an operation using the data element included with the write request that is held in the register interface and the statistic record that is read from the RAM; and
   writing the updated statistic to the statistic record in the array of statistic records that is stored in the RAM;
   further comprising processing multiple write requests corresponding to the same statistic record in the array serially in a register interface in control hardware space of the I/O system.

2. The method of claim 1, wherein reading the statistic record from the array of statistic records comprises generating a physical memory address from an index that is included in the write request and held in the register interface.

3. The method of claim 1, wherein performing the statistic update operation involves update logic in the control hardware space of the I/O system adding a value of the data element to a value in the statistic record.

4. The method of claim 1, wherein the write request includes multiple data elements that correspond to different statistics and wherein multiple statistic records in the array of statistic records are updated in response to the multiple data elements in the write request.

5. The method of claim 1, wherein reading the statistic record according to write request comprises reading multiple adjacent statistic records in the array in the same read.

6. The method of claim 5, wherein the write request includes multiple data elements that correspond to different statistics and wherein the multiple adjacent statistic records in the array of statistic records are updated in response to the multiple data elements in the write request.

7. The method of claim 6, wherein writing the updated statistic to the statistic record comprises writing updated statistics for the multiple adjacent statistic records to the array in the same write.

8. The method of claim 1, further comprising receiving multiple write requests directed to the same statistic record at the register interface and performing the statistic updates in a batch process before the updated statistic is written back to the array of statistic records that are stored in the RAM.

9. A system for statistic management, the system comprising:
random access memory (RAM) that stores an array of statistic records; and
a register interface including:
a register to receive a write request, wherein the write request includes an index and a data element; and
update logic configured to:
read a statistic record from the array of statistic records that is stored in the RAM according to the index in the register interface;
perform a statistic update operation in response to the write request to generate an updated statistic, wherein performing the statistic update operation involves executing an operation using the data element in the register interface and the statistic read from the RAM; and
write the updated statistic to the statistic record in the array of statistic records that are stored in the RAM;
wherein the register interface includes a write request buffer to buffer multiple write requests, and wherein the register interface is configured to process multiple write requests corresponding to the same statistic record in the array serially.

10. The system of claim 9, wherein the register interface is configured to generate a physical memory address from the index stored in the register in order to read the statistic record from the array.

11. The system of claim 9, wherein the write request held in the register of the register interface includes multiple data elements that correspond to different statistics and wherein multiple statistic records in the array of statistic records are updated in response to the multiple data elements in the write request.

12. The system of claim 9, wherein reading the statistic record according to write request comprises reading multiple adjacent statistic records in the array in the same read.

13. The system of claim 12, wherein the write request includes multiple data elements that correspond to different statistics and wherein multiple statistic records in the array of statistic records are updated in response to the multiple data elements in the write request.

14. The system of claim 13, wherein writing the updated statistic to the statistic record comprises writing updated statistics for multiple adjacent statistic records to the array in the same write.

15. The system of claim 9, further comprising a processing element and a bus that connects the processing element to the register interface, and wherein the write request is received on the bus from the processing element.

16. The system of claim 9, wherein the update logic is configured to add a value of the data element to a value in the statistic record.

17. The system of claim 9, wherein the register interface includes a write request buffer to buffer multiple write requests directed to the same statistic record, and wherein the update logic is further configured to perform the statistic updates in a batch process before the updated statistic is written back to the array of statistic records that are stored in the RAM.

* * * * *